United States Patent [19]

Park

[11] Patent Number: 5,673,223
[45] Date of Patent: Sep. 30, 1997

[54] NONVOLATILE SEMICONDUCTOR MEMORY DEVICE WITH MULTIPLE WORD LINE VOLTAGE GENERATORS

[75] Inventor: Jong-Wook Park, Seoul, Rep. of Korea

[73] Assignee: Samsung Electronics Co., Ltd., Suwon, Rep. of Korea

[21] Appl. No.: 661,177

[22] Filed: Jun. 10, 1996

[30] Foreign Application Priority Data

Jun. 9, 1995 [KR] Rep. of Korea .................. 15214/1995

[51] Int. Cl.$^6$ .................................................. G11C 11/34
[52] U.S. Cl. .................. 365/185.17; 365/185.11; 365/185.13; 365/230.06
[58] Field of Search .................. 365/185.17, 185.11, 365/185.13, 189.09, 230.06

[56] References Cited

U.S. PATENT DOCUMENTS 5,101,378  3/1992  Radjy et al. ..................... 365/185.17
5,301,144  4/1994  Kohno ............................. 365/185.11
5,587,948  12/1996  Nakai ............................. 365/185.17

Primary Examiner—David C. Nelms
Assistant Examiner—Huan Hoang
Attorney, Agent, or Firm—Marger, Johnson, McCollom & Stolowitz, P.C.

[57] ABSTRACT

A nonvolatile semiconductor memory device such as a NAND FLASH memory device has a plurality of word line voltage generators, each one generating a different word line voltage for application via a row decoder to the control gates of a corresponding row of memory cells in the matrix. The various word line voltages are selected so as to compensate for the body effects that vary transistor threshold voltages along the memory NAND string, thereby ensuring that adequate read voltage appears at the bit lines to ensure read data accuracy.

10 Claims, 3 Drawing Sheets

NONVOLATILE SEMICONDUCTOR MEMORY DEVICE WITH MULTIPLE WORD LINE VOLTAGE GENERATORS

BACKGROUND OF THE INVENTION

1. Field of the Invention

The present invention relates to semiconductor memory devices and, in particular, to a nonvolatile semiconductor memory device including a plurality of word line voltage generators.

The present application claims priority based on Korean Application No. 15214/1995 which is incorporated herein by reference for all purposes.

2. Description of the Related Art

Recently, NAND flash memory has attracted attention as a useful data storage technology. In utilizing NAND flash memory, as in other memory technologies, it is desirable to provide high storage capacity at low cost. Toward that end, multibit nonvolatile semiconductor memory devices such as electrically erasable and programmable ROM (EEPROM) are known for storing a plurality of data at a single memory cell.

Known methods for reading data stored in a multibit memory device are generally divided into a current sensing method and a voltage sensing method. A current sensing method is disclosed in a paper entitled "A MULTI-LEVEL CELL 32MB FLASH MEMORY", published in "ISSCC '95" by Intel Corp. In the voltage sensing method, where a number of memory cells are connected in series with one another, as can be seen in the NAND flash memory, the cell source potentials vary from one memory transistor to another as a function of the position of a selected memory cell. This is because the turn-on resistances of the unselected memory cells causes each value Vsb (i.e. the difference between the source potential and a bias potential) to vary, depending on the position of the memory cell in the series. As the value Vsb becomes positive (+), threshold voltages of the memory cells increase. Even though a constant word line voltage level is applied to the various memory cells, the bit line potential varies with the position of the memory cell due to variations in the threshold voltages (hereinafter referred to as Vt) from one memory cell to another, as further explained below with reference to FIG. 1.

FIG. 1 is a diagram illustrating a prior art nonvolatile semiconductor memory device having a row decoder and a word line voltage generator. As shown in FIG. 1, the prior art nonvolatile semiconductor memory device is constructed with a pass voltage generator 20 for providing a predetermined pass voltage to the unselected word lines, and a word line voltage generator 30 for supplying a word line voltage to a selected word line (one word line is selected at a time). Memory cell transistors M1 to M16 have their channels connected in series between a first selection transistor ST1 and a second selection transistor ST2. (A similar series arrangement of transistors appears in a CMOS NAND gate—hence the name NAND flash memory.) A row decoder 10 selects one word line at a time according to row address RA input data. The row address decoder 10 applies the word line voltage (from 30) to the selected word line, and applies the pass voltage (from 20) to all of the unselected word lines. First and second selection lines SL1 and SL2 and word lines WL1 to WL16 are coupled to respective output terminals of the row decoder 10. The first and second selection transistors ST1 and ST2 and the memory cells M1 to M16 are coupled in series with one another between a bit line BL1 and a read voltage input Vread. Bit line BL1 is just the first one of a series of bit lines (not shown), each of which runs serially through the array.

In connection with the voltage sensing method as embodied in the prior art NAND multibit memory as depicted in FIG. 1, a word line voltage of a predetermined level is applied to the gate of the selected memory cell, regardless of the position of the selected memory cell in the memory string. By "string" we refer to the series connection of memory cells M1 to M16. Similarly, the fixed "pass voltage" used to pass the read voltage Vread through all of the remaining memory cells except for the selected memory cell. A voltage obtained by subtracting the threshold voltage of the selected memory cell from its gate voltage (i.e., the word line voltage), i.e. ($V_{WL}$–Vt) is applied to the bit line BL1. However, the threshold voltages are not all the same. For instance, the source voltages at nodes N0, N1 and N2 are affected, respectively, by the first selection transistor ST1, and the memory transistors M1 and M2. As the source voltages rise, the source potential at a selected memory transistor differs from that of a nonselected memory transistor. The nonselected memory transistors are in a turn-on state in which the pass voltage is applied to the gate of the nonselected memory cell, but they nonetheless present a voltage drop effect as a result of the turn-on resistance value of the memory transistors. This effect is cumulative along the memory string due to the series connection of the memory strings.

Thus, the source potential varies as a function of node position on the memory string. The voltage between source and substrate (also called the substrate bias) likewise varies, and consequently the threshold voltages of the memory transistors varies along the string between ST2 and ST1. This is called body effect. For this reason, the actual threshold voltage varies with the position of the memory cell and, consequently, the voltage applied to the bit line varies. Even if the memory cell is erased to a given potential, the bit line potential will vary depending upon its position on the memory string. These variations are problematic in that they compromise noise margin and hence can lead to erroneous read data.

SUMMARY OF THE INVENTION

It is therefore an object of the present invention to provide a nonvolatile semiconductor memory device with improved reliability.

It is another object of the present invention to provide a nonvolatile semiconductor memory device having a plurality of word line voltage generators, capable of stably reading data.

According to one aspect of the invention, a nonvolatile semiconductor memory device has at least one memory block, each of the memory blocks including a plurality of memory cells arranged in a matrix format of rows and columns. Each column includes a predetermined number of series-connected memory transistors, i.e. a NAND-type string of memory cells. A row decoder circuit selects one at a time of the rows of the block in response to row address data input to the decoder. Each row of cells is controllably selected for a read or write operation by a corresponding word line coupled to the gates of the memory transistors in the memory cells along the row. The decoder applies a predetermined pass voltage to all of the nonselected word lines, and applies a selected word line voltage to the selected word line. The word line voltage is selected from a plurality of word line voltage generators according to the position of the selected word line along the column or memory string.

Preferably, a separate word line voltage generator is provided for each row (or word line) of the memory block. The selected word line voltage compensates for the body effect variations described above and thereby improves read data reliability.

BRIEF DESCRIPTION OF THE DRAWINGS

A more complete appreciation of this invention, and many of the attendant advantages thereof, will be readily apparent as the same becomes better understood by reference to the following detailed description when considered in conjunction with the accompanying drawings, in which like reference symbols indicate the same or similar elements components, and wherein.

DETAILED DESCRIPTION OF A PREFERRED EMBODIMENT

Figure 1:
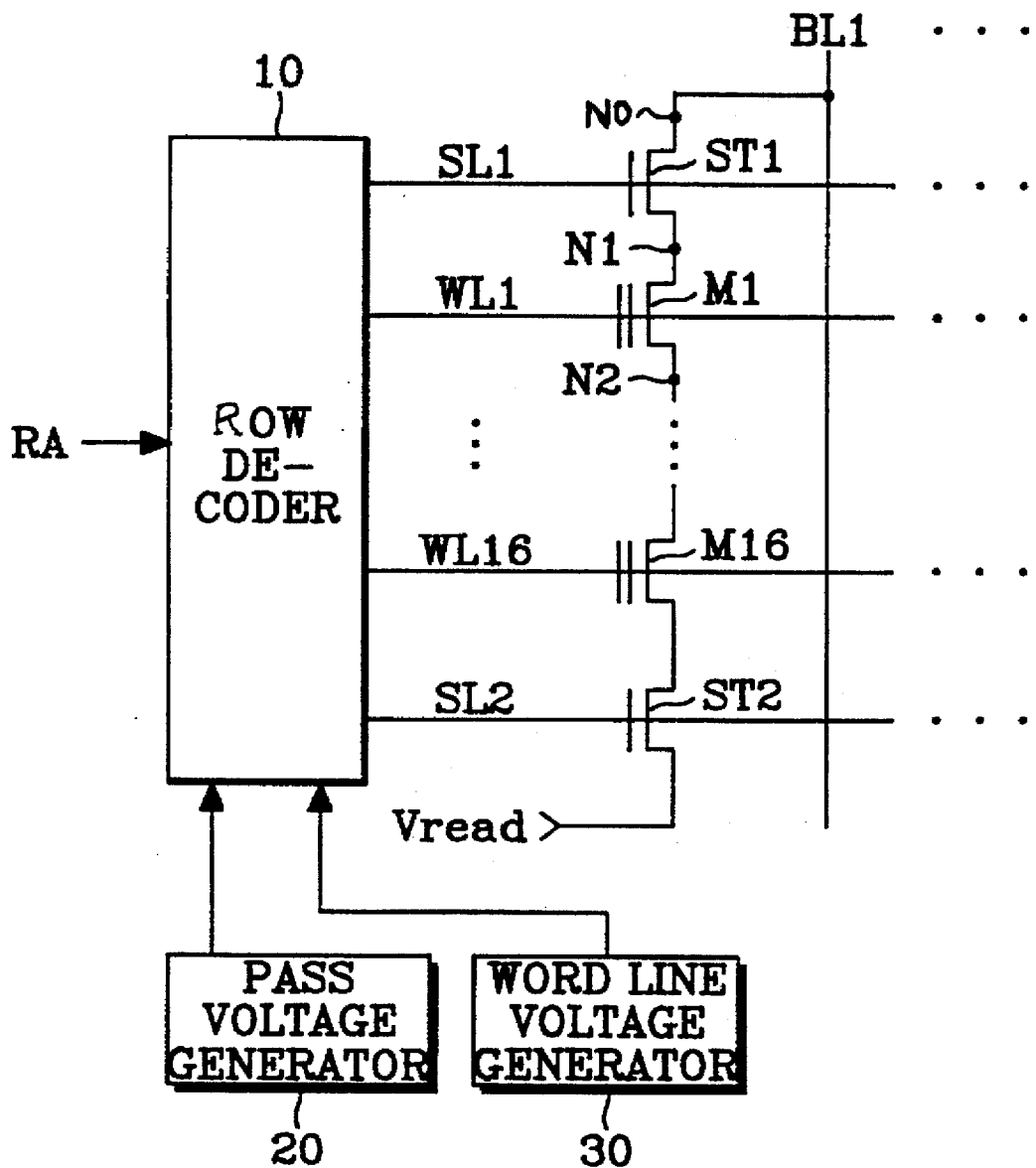
FIG. 1 is a diagram illustrating a prior art nonvolatile semiconductor memory device having a row decoder and a single word line voltage generator.

Throughout the drawings, it is noted that the same reference numerals or letter will be used to designate like or equivalent elements having the same function. Further, in the following description, several specific details are set forth to provide a more through understanding of the present invention. It will be apparent, however, to one skilled in the art that the present invention is not limited to these specific details. Variations on the theme will be appropriate depending on the specific application.

Figure 2:
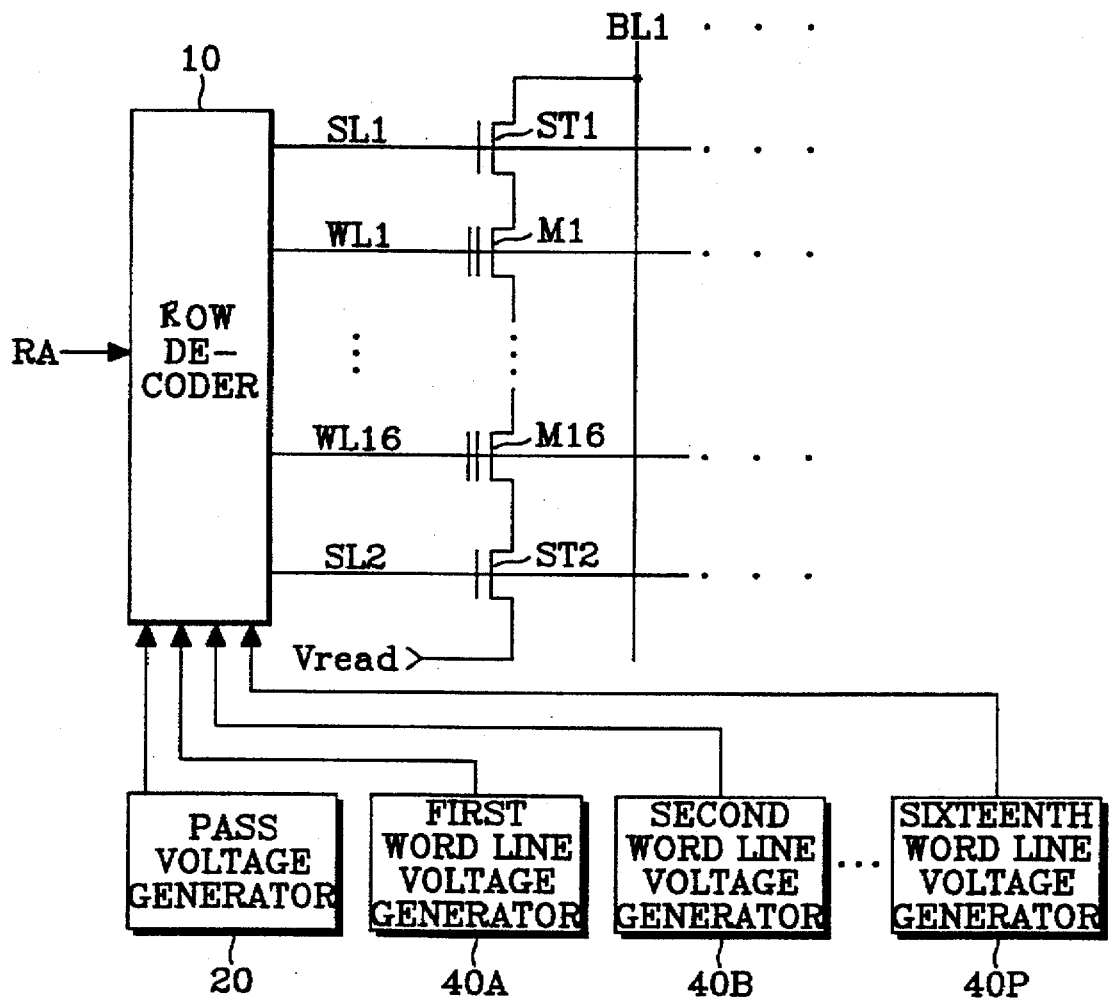
FIG. 2 is a diagram illustrating a nonvolatile semiconductor memory device having a row decoder and a plurality of word line voltage generators according to the present invention.

FIG. 2 is a diagram illustrating a nonvolatile semiconductor memory device having a row decoder and a plurality of word line voltage generators according to the present invention. As shown in FIG. 2, 16 memory transistors are used in a memory string adapted to an embodiment of the present invention, but it should be noted that the present invention is not necessarily limited to 16 rows. The number of rows is not critical. The invention is useful in connection with an arbitrary number or rows, while 16 or 32 rows would be typical of a commercial embodiment today. Referring now to FIG. 2, a pass voltage generator 20 provides a predetermined pass voltage. Details of the pass voltage generator are known. The pass voltage is applied to all of the nonselected word lines upon reading stored data. 16 word line voltage generators 40A to 40P are shown for generating respective word line voltages. A corresponding one of the word line voltages is applied to the selected word line. Each word line voltage is greater than the preceding one, beginning with a minimum level at the 16th word line voltage (provided by the 16th word line voltage generator 40P), applied to word line WL16 when selected, and gradually increasing as the word lines move up the memory string, up to a maximum level at WL1, supplied by the first word line voltage generator 40A. The row decoder 10 couples the word line voltage corresponding to the selected row in accordance with a row address RA, and couples the pass voltage to the remaining nonselected word lines, as shown.

As stated hereinabove, among the word line voltages which are respectively supplied from the 16 word line voltage generators 40A to 40P, the row decoder 10 provides the word line voltage corresponding to one word line in one memory string, according to a coding signal (not shown). That is to say, the row decoder 10 includes circuits for supplying the word line voltage corresponding to the selected word line in the selected memory string and for supplying the pass voltage to the unselected word line in the unselected memory string, by using a block address signal (not shown) for selecting a memory block where a plurality of the memory strings are arranged, and the coding signal for selecting one of 16 word lines, i.e., one word line pertaining to the one memory string. The row decoder 10 includes logic circuits for responding to a block address signal and the row address input data, and includes transmission gates to selectively pass the word line voltage. Details of row decode logic are known, are as the particulars of CMOS transmission gates.

Figure 3:
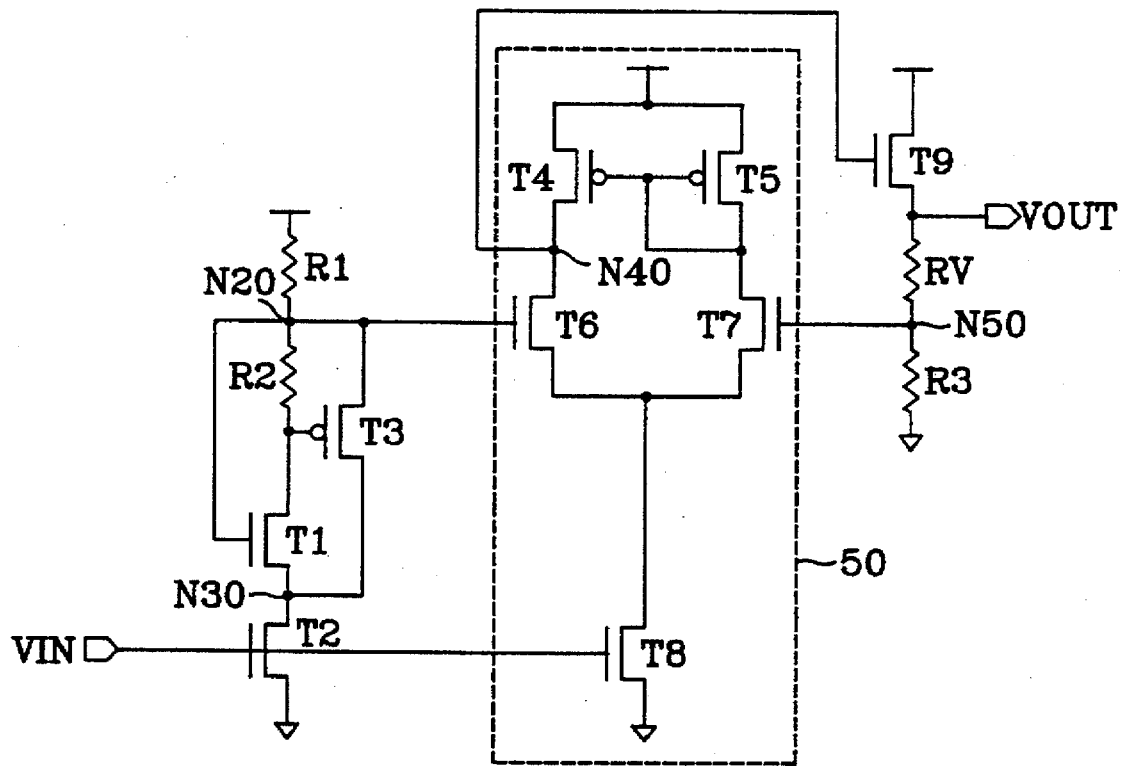
FIG. 3 is a detailed schematic diagram illustrating a word line voltage generator circuit according to one embodiment of the present invention.

FIG. 3 is a more detailed schematic diagram illustrating a word line voltage generator according to an embodiment of the present invention, which is exemplary of the various word line voltage generators 40A—0P of FIG. 2. With reference to FIG. 3, resistors R1 and R2, and NMOS transistors T1 and T2 are connected in series with one another between the power supply voltage VCC and the ground voltage VSS. A first PMOS transistor T3 is connected between a node N20 between the resistors R1 and R2, and a node N30 between the NMOS transistors T1 and T2. The PMOS transistor T3 gate is coupled to a node between the resistor R2 and the NMOS transistor T1. A gate of the NMOS transistor T2 is coupled to an external voltage input terminal VIN. The external voltage input terminal VIN also is connected to the gate of an NMOS transistor T8 for switching the connection between differential amplifier 50 and the ground voltage VSS. Input voltage VIN thus turns the word line voltage generator on or off. This VIN signal can be provided by the row decoder logic, since only the selected row word line voltage generator is needed at one time.

Node N20 is connected to one input terminal of the differential amplifier 50 to provide a constant reference voltage. The gate of NMOS transistor T1 is coupled to the node N20. A second input terminal of the differential amplifier 50 is connected to node N50 between resistors RV and R3 which are connected in series with each other between an output terminal VOUT and the ground voltage VSS. Another NMOS transistor T9 has its gate connected to an output node N40 of the differential amplifier 50, and is disposed between the output terminal VOUT and the power supply voltage VCC. In a presently preferred embodiment of the present invention, the differential amplifier 50 is similar to the well-known current mirror, comprised of a differential pair of NMOS transistors T6 and T7, and two PMOS transistors T4 and T5. The output terminal VOUT is connected to the row decoder 10 of FIG. 2 to supply the word line voltage.

The 16 word line voltage generators, 40A to 40P respectively, provide different output voltages at VOUT. As an example, if the voltage level applied to word line WL1 is below 1 V, the level applied to a word line WL16 is 1.6 V. Thus, 1 V is applied to the word line WL1, 1 V +0.6/15 V is applied to the word line WL2 and 1 V+2* (0.6/15)V is applied to the word line WL3. Each of 16 differentiated word line voltages is determined by this method. In other words, a minimum word line voltage and a maximum word line voltage level are determined, and the intermediate values corresponding to the intermediate word lines are determined by linear interpolation. The appropriate voltage level is provided in each word line voltage generator by selecting the value of the variable resistor RV. The pass voltage typically is 2.8 V, although the present invention is not necessarily limited to 2.8 V. Detailed explanation of the pass voltage generator 20 for generating the pass voltage is omitted herein as it can be implemented using the well-known charge pump circuit.

Referring again to FIG. 2, in operation, the read voltage input Vread applied through the second selection transistor ST2, generates the bit line potential, subject to the voltage drop occasioned by the turn-on resistance of the nonselected memory cells and the voltage drop Vgs (generated by subtracting voltage between the gate and the source) from the threshold voltage Vt) by the selected memory cell. Here, the source terminal of each memory cell is effectively positioned adjacent to the bit line. Accordingly, if the word line voltage applied to the selected memory cell is constant regardless of the position of the memory cell, the threshold voltage rises, largely due to the body effect of the memory transistors, as noted above. The source potential of the memory cell is highly induced, thereby causing the bit line voltage to be lowered. However, employing the present invention, the selected word line voltage is higher as applied to the memory cell located adjacent to the bit line. As a result, the threshold voltage rise effect heightened by the body effect is compensated so that the bit line voltage is maintained, regardless of the position of the memory cell. This arrangement prevents erroneous read data.

While there have been illustrated and described what are considered to be preferred embodiments of the present invention, it will be understood by those skilled in the art that various changes and modifications may be made, and equivalents may be substituted for elements thereof without departing from the true scope of the present invention. In addition, many modifications may be made to adapt a particular situation to the teaching of the present invention without departing from the central scope thereof. Therefore, it is intended that the present invention not be limited to the particular embodiment discloses as the best mode contemplated for carrying out the present invention, but that the present invention includes all embodiments falling within the scope of the appended claims.

What is claimed is:

1. A nonvolatile semiconductor memory device having a plurality of memory blocks, each of said memory blocks including a plurality of memory cells arranged in a matrix format of rows and columns, and each of said columns including a predetermined number of series-connected memory transistors, and the device further comprising:

a row decoder for selecting one row at a time of the memory cells in response to applied row address data;

a pass voltage generator coupled to the row decoder to provide a predetermined pass voltage;

a plurality of word line voltage generator circuits coupled to the row decoder to provide a plurality of different word line voltages;

means in the row decoder for applying the pass voltage to all of the word lines except the word line corresponding to the selected row; and means in the row decoder for applying a corresponding one of the word line voltages to the word line corresponding to the selected row.

2. A nonvolatile semiconductor memory device according to claim 1 wherein the device comprises an array of NAND type flash memory.

3. A nonvolatile semiconductor memory device according to claim 1 wherein each of the word line voltage generator circuits includes a differential amplifier and a constant voltage source.

4. A nonvolatile semiconductor memory device according to claim 1 wherein the number of word line voltage generator circuits is equal to the number of rows in the matrix of memory cells.

5. A nonvolatile semiconductor memory device according to claim 1 wherein:

the number of word line voltage generator circuits is equal to the number of rows in the matrix of memory cells; and the matrix comprises NAND type flash memory cells.

6. A nonvolatile semiconductor memory device according to claim 5 wherein each of the word line voltage generator circuits includes:

a differential amplifier;

a constant voltage source coupled to a first input of the differential amplifier; and an output circuit coupled to a second input of the differential amplifier, the output circuit including an output terminal coupled to the row decoder to provide the corresponding word line voltage, and further including a resistor coupled to the second input of the differential amplifier so selecting the said word line voltage by selecting a value of the resistor.

7. A method of compensating for variations in transistor threshold voltages along a NAND string of memory transistors in a NAND type of nonvolatile semiconductor memory device, the method comprising the steps of: providing a plurality of word line voltage generators, each word line voltage generator providing a different adjusted word line voltage;

selecting one word line in accordance with row address input data; and applying a corresponding one of the adjusted word line voltages to the selected word line for reading data from the corresponding memory cells.

8. A method according to claim 7 including selecting a word line voltage according to a position of the selected word line along the NAND memory string so as to compensate for a variation in transistor threshold voltage along the NAND memory string.

9. A method according to claim 7 including providing one corresponding word line generator circuit for each one of the word line control signals in the memory matrix.

10. A method according to claim 7 including:

selecting a minimum word line voltage level effective for selecting a first one of the word lines;

selecting a maximum word line voltage level effective for selecting a last one of the word lines; and selecting intermediate word line voltage levels for each of the remaining word lines by linear interpolation between the minimum and maximum word line voltage levels.

* * * * *